United States Patent [19]
Ishikawa et al.

[11] Patent Number: 5,838,526
[45] Date of Patent: Nov. 17, 1998

[54] LOAD ACTUATION CIRCUIT WITH A SURGE PROTECTING FUNCTION

[75] Inventors: Fukuo Ishikawa, Kariya; Akira Sugiura, Okazaki; Masahisa Makino, Oobu; Hiroyuki Ban, Aichi-ken, all of Japan

[73] Assignees: Anden Co. Ltd, Anjo; Denso Corporation, Kariya, both of Japan

[21] Appl. No.: 852,512

[22] Filed: May 7, 1997

[30] Foreign Application Priority Data

May 7, 1996 [JP] Japan ................................ 8-112399

[51] Int. Cl.$^6$ ......................................... H02H 9/00
[52] U.S. Cl. ............................. 361/118; 361/56; 361/111; 361/115
[58] Field of Search ....................... 361/91, 93, 115, 361/56, 111, 113, 100, 118

[56] References Cited

U.S. PATENT DOCUMENTS 5,444,595  8/1995  Ishikawa et al. .......................... 361/86
5,465,190 11/1995  Meunier et al. .......................... 361/91

FOREIGN PATENT DOCUMENTS 50-036942  4/1975  Japan ................................ H02H 7/20
62-090717  4/1987  Japan ................................ H02H 7/20
62-152331  7/1987  Japan ................................ H02H 3/00

*Primary Examiner*—Jeffrey A. Gaffin
*Assistant Examiner*—Stephen Jackson
*Attorney, Agent, or Firm*—Pillsbury Madison & Sutro

[57] ABSTRACT

In a load actuation circuit of an emitter-follower circuit arrangement, a surge detection circuit detects a power surge voltage superposed on a power voltage of a power line. A feed circuit supplies current to a control electrode of an output transistor (i.e. emitter-follower transistor) from the power line to turn on the output transistor forcibly when any power surge voltage is detected by the surge detection circuit. Thus, the power surge voltage is absorbed by the output transistor.

12 Claims, 5 Drawing Sheets

LOAD ACTUATION CIRCUIT WITH A SURGE PROTECTING FUNCTION

BACKGROUND OF THE INVENTION

1. Field of the Invention:

This invention relates to a load actuation circuit, and more particularly to an improvement of a transistor protecting function of the load actuation circuit having an emitter-follower circuit arrangement.

2. Related Art:

Laid-open Japanese Patent Application No. 50-36942, published in 1975, discloses a protection circuit protecting a transistor (i.e., a driver element) actuating a load against an excessive voltage (i.e., a power surge voltage) superposed on a power voltage. According to this protection circuit, a constant-voltage diode (hereinafter, referred to as Zener diode) and a current-limiting resistor are connected in series to constitute a surge responsive circuit. This surge responsive circuit is interposed between a control terminal of the driver element and a high-potential power line. The surge responsive circuit turns on the driver element only when the power voltage exceeds a breakdown voltage of the Zener diode.

In short, this protection circuit supplies current to the base of an emitter grounded transistor acting as the driver element via the Zener diode and the current-limiting resistor in response to a superposed power surge voltage. The driver element, turned on by this current supply, absorbs and eliminates the power surge voltage.

In some cases, an output transistor may be incorporated in an emitter-follower circuit that is characterized by a collector receiving electric power from a power line and an emitter grounded via a load.

However, the above-described conventional protection circuit cannot be directly applied to this kind of output transistor of an emitter-follower circuit arrangement for the reasons described below.

In combining the above-described conventional protection circuit with an emitter-follower circuit, the surge sensitive circuit (i.e., a serial arrangement of a Zener diode and a current-limiting resistor) is connected between the base and collector of an emitter-follower transistor. A power surge voltage (i.e. positive surge) may be produced with a magnitude large enough to cause a breakdown of the Zener diode. In this case, even if current is supplied to the base of the emitter-follower transistor, the base-collector voltage of the emitter-follower transistor becomes larger than a breakdown voltage of the Zener diode by an amount equivalent to a voltage drop at the current-limiting resistor.

As a result, a large collector loss (=collector current×base-collector voltage) is generated. There is a possibility that a power surge voltage may last for a long duration. In view of the above, the durability of the output transistor (i.e., emitter-follower transistor) needs to be grate enough to endure the above-described collector loss. Thus, the overall size of the output transistor becomes large.

In this respect, a conventional emitter-grounded transistor receives a base current supplied to its base via the surge responsive circuit in response to a power surge voltage, and is turned on by this base current. In this case, the collector potential of the conventional emitter-grounded transistor becomes a grounded potential. Thus, the problems relating to collector loss increase and heat generation will not be caused.

To supply a sufficient collector current Ic to an emitter-follower transistor, it is necessary to increase its base potential sufficiently by an amount equivalent to the sum of (load impedance Z×collector current Ic+base-emitter on voltage Vbe). This requires a large base charge current flowing across the surge responsive circuit. A post-stage control circuit is provided for controlling the emitter-follow transistor. An output terminal of the post-stage control circuit is maintained at a low level, when the emitter-follow transistor is turned off. Current is supplied from the surge responsive circuit to the base of the emitter-follower transistor (or a gate of IGBT An). This current is absorbed by the control circuit. This is undesirable in that the power surge voltage cannot be absorbed sufficiently, because the turning-on of the emitter-follower transistor is delayed and the current absorbing amount is limited significantly.

Furthermore, the power surge voltage applied from the surge responsive circuit to the base of the emitter-follower transistor may enter into the control circuit via its output terminal. This will result in a breakdown of an output transistor or various transistors at their PN junctions involved in the control circuit. For this reason, the above-described conventional art requires enhancement of the durability of elements constituting the control circuit.

Still further, an emitter-follower transistor may be used to control a large reactance load. In such a case, at a moment when the emitter-follower transistor is turned off, its base potential is quickly reduced to a negative voltage due to a large reverse electromotive voltage of the reactance load. Therefore, the withstanding voltage for the base-collector terminals of the emitter-follower transistor needs to be increased to endure such a negative voltage. This is not desirable in that improving the collector withstanding voltage of an output transistor necessitates a modification of its manufacturing process and increases the collector loss.

SUMMARY OF THE INVENTION

An object of the present invention is to solve the above-described problems. More specifically, an object of the present invention is to improve the durability against any surge voltage in a load actuation circuit having an emitter-follower transistor as an output transistor.

An object of the present invention is to provide a load actuation circuit capable of effectively absorbing a power surge voltage superposed on the electric power.

An object of the present invention is to provide a system robust against a power surge voltage even if the power surge voltage is applied to the output terminal of a control circuit of the load actuation circuit.

An object of the present invention is to reduce the power consumption in the load actuation circuit.

An object of the present invention is to reduce the collector loss in the output transistor of an emitter-follower type when a power surge voltage is absorbed.

An object of the present invention is to provide a load actuation circuit capable of surely preventing any backward current flowing from the control electrode of the output transistor to the output terminal of the control circuit.

An object of the present invention is to provide a load actuation circuit capable of quickly increasing the electric potential of the control electrode of the output transistor.

An object of the present invention is to provide a load actuation circuit capable of realizing a speedy absorption of a power surge voltage by the output transistor.

An object of the present invention is to provide a load actuation circuit capable of surely protecting a delicate junction of an internal transistor in the control circuit against a power surge voltage.

Still another object of the present invention is to provide a load actuation circuit capable of surely protecting the output transistor against a negative surge voltage without increasing the withstanding voltage of this output transistor.

In order to accomplish above-described and other related objects, the present invention provides a novel and excellent load actuation circuit having various aspects which will be described hereinafter with reference to numerals in parentheses which show the correspondence to the components described in preferred embodiments of the present invention described later. Reference numerals in parentheses, added in the following description, are merely used for the purpose of helping the understanding to the present invention and not used for narrowly interpreting the scope of claims of the present invention.

More specifically, a first aspect of the present invention provides a load actuating circuit with a surge protection function characterized by the following features.

An output transistor (T1) has a collector receiving a power voltage from a power line (200) and an emitter connected to one end of a load (202) that is grounded at the other end. A control circuit (103) controls an electric potential of a control electrode of the output transistor (T1) to turn on or off the output transistor (T1). A surge detection circuit (101) detects a power surge voltage superposed on the power voltage of the power line (200). And, a feed circuit (104), responsive to a surge detection voltage of the surge detection circuit (101), supplies current to the control electrode of the output transistor (T1) from the power line (200) to turn on the output transistor (T1) when any power surge voltage is detected by the surge detection circuit (101).

Preferably, the surge detection circuit (101) comprises a constant-voltage diode (D3, D4, D5) and at least one resistance element (R11, R12; R21) connected in series between the power line (200) and a ground line (201). The power surge voltage is detected by a voltage drop at the resistance element (R11, R12).

In more detail, the constant-voltage diode (D3) of the surge detection circuit (101) has a cathode connected to the power line (200). A lower-potential terminal of the resistance element (R12) of the surge detection circuit (101) is connected to the ground line (201). The feed circuit (104) comprises an inversion circuit (T3, R3, R4) and an activation control section (T2). The inversion circuit (T3, R3, R4) is turned on in response to the surge detection voltage produced from the surge detection circuit (101) and generates a low-level potential. And, the activation control circuit (T2) is turned on in response to the low-level potential of the inversion circuit (T3, R3, R4) and supplies electric power from the power line (200) to the control electrode of the output transistor (T1).

According to another embodiment the constant-voltage diode (D5) of the surge detection circuit (101) has an anode connected to the ground line (201). A higher-potential terminal of the resistance element (R21) of the surge detection circuit (101) is connected to the power line (200). The feed circuit (104) comprises a transistor (T2) turned on in response to the surge detection voltage produced from the surge detection circuit (101) and supplies a high-level potential to the control electrode of the output transistor (T1).

Preferably, the collector of the output transistor (T1) is connected to the power line (200) via a resistant element (R1).

Preferably, the load actuation circuit further comprises a junction diode (D2) preventing flow of backward current from the control electrode of the output transistor (T1) to an output terminal of the control circuit (103).

Furthermore, the control circuit (103) has an output terminal grounded only through the load (202).

A second aspect of the present invention provides a load actuation circuit with a surge protection function characterized by the following features.

An output transistor (T1) has a collector receiving a power voltage from a power line (200) and an emitter connected to one end of a load (202) that is grounded at the other end. A control circuit (103) controls an electric potential of a control electrode of the output transistor (T1) to turn on or off the output transistor (T1). A feed circuit (104) supplies current to the control electrode of the output transistor (T1) from the power line (200) to turn on the output transistor (T1) when any power surge voltage is superposed on the power voltage of the power line (200). And, a junction diode (D2) prevents flow of backward current from the control electrode of the output transistor (T1) to an output terminal of the control circuit (103).

Preferably, the feed circuit (104) of the second aspect load actuation circuit comprises a constant-voltage diode (D6, D7, D8) and a current-limiting resistant element (R31) serially connected between the power line (200) and the control electrode of the output transistor (T1).

A third aspect of the present invention provides a load actuation circuit with a surge protection function characterized by the following features.

An output transistor (T1) has a collector receiving a power voltage from a power line (200) and an emitter connected to one end of a load (202) that is grounded at the other end. A control circuit (103) controls an electric potential of a control electrode of the output transistor (T1) to turn on or off the output transistor (T1). A feed circuit (104) supplies current to the control electrode of the output transistor (T1) from the power line (200) to turn on the output transistor (T1) when any power surge voltage is superposed on the power voltage of the power line (200). And, the control circuit (103) has an output terminal grounded only through the load (202).

A fourth aspect of the present invention provides a load actuation circuit with a surge protection function characterized by the following features.

An output transistor (T1) has a collector receiving a power voltage from a power line (200) and an emitter connected to one end of a reactance load (202) that is grounded at the other end. A control circuit (103) controls a base potential of the output transistor (T1) to turn on or off the output transistor (T1). And, a feed circuit (105) supplies current to a base of the output transistor (T1) from a ground line (201) when the base potential of the output transistor (T1) falls below a ground potential by an amount exceeding a collector-base withstanding voltage of the output transistor (T1).

Preferably, the feed circuit (105) of the fourth aspect load actuation circuit comprises a resistance element (R2) connecting the base of the output transistor (T1) to the ground line (201), and a junction diode (D1) connected in series with the resistance element (R2) preventing current from flowing across the resistance element (R2) in a direction from the base of the output transistor (T1) to the ground line (201).

BRIEF DESCRIPTION OF THE DRAWINGS

The above and other objects features and advantages of the present invention will become more apparent from the following detailed description which is to be read in conjunction with the accompanying drawings, in which.

DESCRIPTION OF THE PREFERRED EMBODIMENTS

Figure 1:
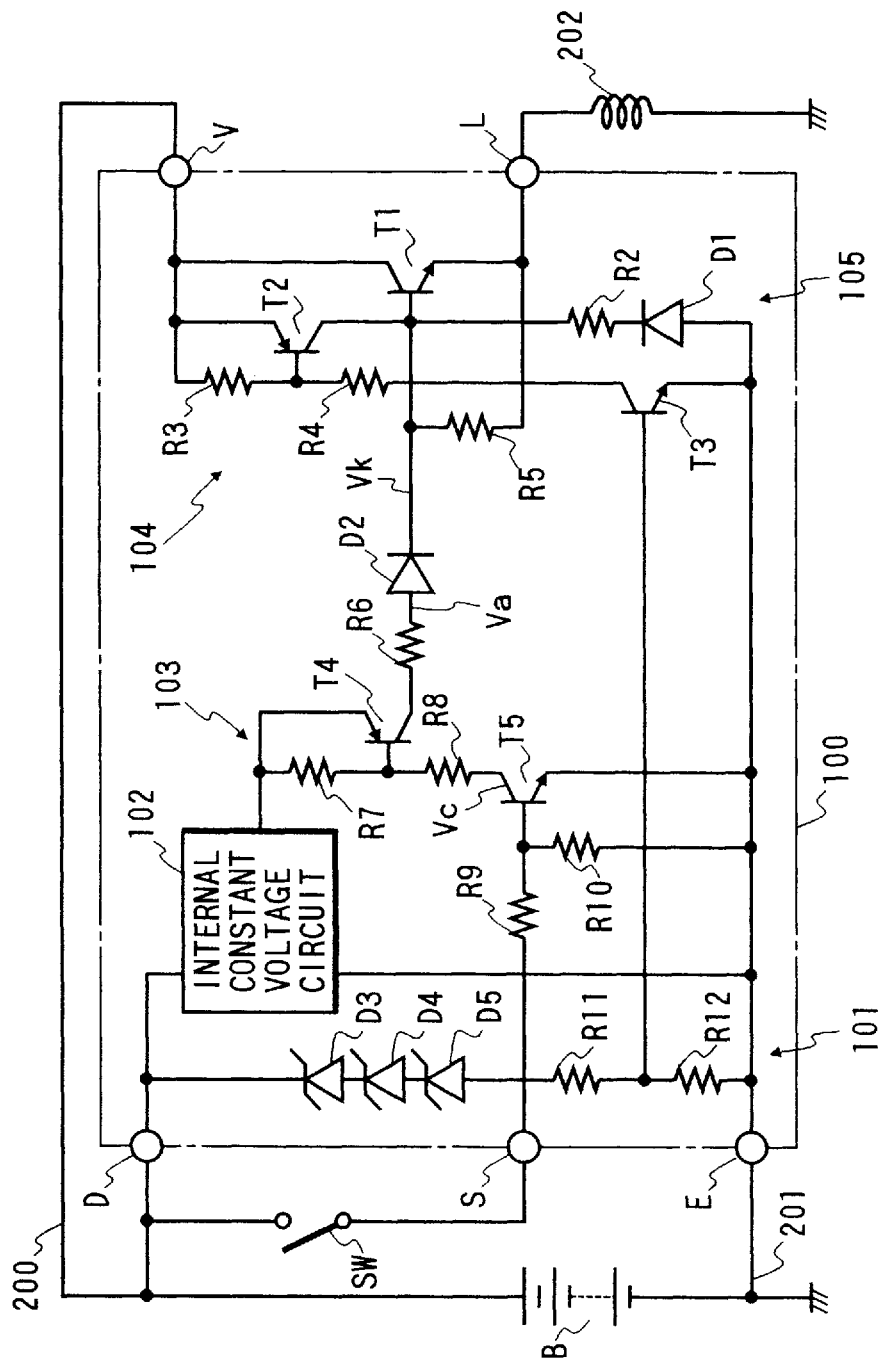
FIG. 1 is a circuit diagram showing a load actuation circuit in accordance with a first embodiment of the present invention.

Preferred embodiments of the present invention will be explained hereinafter with reference to accompanied drawings. Identical parts are denoted by the same reference numerals throughout the drawings.

First Embodiment

A load actuation circuit 100 comprises a surge detection circuit 101, an internal constant voltage circuit 102, a control circuit 103, a junction diode D2 having a function of preventing a backward current, a first feed circuit 104, a second feed circuit 105, a bypass resistor R5, and an output transistor T1.

A power line 200 extends from a high voltage terminal of a battery B. The other terminal of the battery B is grounded via a ground line 201.

The surge detection circuit 101 is interposed between the power line 200 and the ground line 201. The surge detection circuit 101 comprises three Zener diodes (i.e., constant-voltage diodes) D3, D4 and D5 and two resistors R11 and R12 that are serially connected in this order from the high voltage side to the ground potential side. A cathode of Zener diode D3 is connected to the power line 200 (i.e., high voltage terminal of the battery B). The lower-potential terminal of the resistor R12 is connected to the ground line 201.

The control circuit 103 comprises two transistors T5 and T4 and resistors R6, R7, R8, R9 and R10.

The first feed circuit 104 comprises an NPN transistor T3, a PNP transistor T2, a resistor R3 and a resistor R4. The NPN transistor T3 has an emitter that is grounded. The PNP transistor T2 has an emitter that is grounded. Resistors R3 and R4 are connected in series so as to constitute a voltage dividing circuit. Furthermore, resistors R3 and R4 serve as a load for transistor T3. The base of transistor T2 is connected to an intermediate portion between resistors R3 and R4. The emitter of transistor T2 is connected to the power line 200. The collector of transistor T2 is connected to the base (i.e., control electrode) of output transistor T1.

The second feed circuit 105 comprises resistor R2 and junction diode D1 connected in series. The second feed circuit 105 is interposed between the base of output transistor T1 and the ground line 201.

The output transistor T1 is an emitter-follower transistor having a collector connected to the power line 200 and an emitter grounded via reactance load 202. The load actuation circuit 100 has terminals D, S, E, V and L. Terminals D and V are connected to the high voltage terminal of the battery B. Terminal E is connected to the ground terminal of the battery B. An external switch SW is provided between terminals D and S. And, the terminal L is connected to the reactance load 202.

The operation of the above-described actuation circuit will be explained.

When external switch SW is closed, the power voltage of power line 200 is applied to the resistors R9 and R10 serially connected. With this application of power voltage, the NPN transistor T5 is turned on. The NPN transistor T5, that has a grounded emitter arrangement, is connected in parallel with the resistor R10. Resistors R7 and R8 serve as a load for transistor T5. Internal constant voltage circuit 102 supplies collector current flowing into transistor T5 through resistors R7 and R8. The collector current causes a voltage drop across resistor R7. In response to this voltage drop, the PNP transistor T4 is turned on. The PNP transistor T4 has a grounded emitter arrangement. Upon transistor T4 turning on, electric power is supplied to the reactance load 202 via resistor R6, junction diode D2 and resistor R6. A voltage drop is caused across resistor R5. The magnitude of this voltage drop exceeds a predetermined base-emitter ON voltage for output transistor T1 that is an emitter-follower transistor. Thus, transistor T1 is turned on. In other words, the collector current flows with an amount proportional to the base current flowing between the base and the emitter of transistor T1. In this manner, transistor T1 has a function of feeding current to reactance load 202.

When the external switch SW is opened, transistors T5 and T4 are turned off. Thus, no base current flows into the output transistor T1. This quickly reduces both of the base potential and the emitter potential of the output transistor T1. Especially, in the first embodiment, the load 202 is a reactance load that causes a reverse electromotive force and a negative surge voltage. Therefore, the base potential and the emitter potential of the output transistor T1 tend to have negative potentials due to such an abrupt reduction.

The base potential reduction of the output transistor T1, entering into a negative potential region, turns on the junction diode D1 of the second feed circuit 105. Electric power is thus supplied to the base of output transistor T1 via resistor R2 from the ground line 201. The resistor R2 has a function of limiting current flowing across the junction diode D1. Hence, the potential reduction of the base and the emitter of output transistor T1 is prevented. In other words, the breakdown of the output transistor T1 at its base-collector terminals is prevented effectively.

In short, the second feed circuit 105 supplies current to the base of output transistor T1 from the ground line 201 in an event the base potential of the output transistor T1 may fall below a ground potential by an amount exceeding a collector-base withstanding voltage of the output transistor T1.

As an extraordinary condition, there is a possibility that a power surge voltage (i.e., a positive surge voltage) may be superposed on the power voltage of the power line 200. An operation of the above-described actuation circuit in such an extraordinary condition will be explained hereinafter.

The power surge voltage superposed on the power line 200 may exceed a breakdown threshold for Zener diodes D3, D4 and D5. As a result of this nondestructive breakdown of Zener diodes D3, D4 and D5, current flows across the voltage dividing circuit consisting of the resistors R11 and R12 serially connected. An output of this voltage dividing circuit, i.e., an intermediate potential between resistors R11 and R12, is applied to the base of transistor T3 and the transistor T3 is turned on.

Then, a voltage drop is caused at resistor R3 in accordance with collector current flowing through transistor T3. This voltage drop is applied to the base-emitter terminals of transistor T2, and the transistor T2 is turned on. Then, electric power is supplied from the power line 200 to the output transistor T1 via the thus-activated transistor T2. The output transistor T1 is turned on accordingly. In other words, the power surge voltage superposed on power line 200 is absorbed by the output transistor T1 effectively and is attenuated sufficiently.

The power surge voltage superposed on the power line 200 may disappear. After that, Zener diodes D3, D4 and D5 of the surge detection circuit 101 recover from the breakdown condition. In response to the recovery of Zener diodes D3, D4 and D5, both of the transistors T3 and T2 are turned off. Therefore, d.c. electric power consumption is reduced effectively.

Furthermore, there is a possibility that the power surge voltage superposed on the power line 200 may turn on the transistor T2. In this case, the power surge voltage is applied to the base of output transistor T1 via the transistor T2. On the other hand, the power surge voltage increases a cathode potential Vk of the junction diode D2. To prevent any adverse effect by the power surge voltage, it is effective that the junction diode D2 has a breakdown voltage high enough to endure such a surge voltage. For example, it is preferable to constitute the junction diode D2 by a plurality of junction diodes connected in series. As a result, an increase of anode potential Va is prevented surely.

With this arrangement, it becomes possible to provide a system robust against a power surge voltage. Even if the power surge voltage is applied to the output terminal of the control circuit 103 via the transistor T2, it does not enter the inside of control circuit 103 through the collector-base junction of its output transistor T4. Thus, a collector potential Vc of the transistor T5 is not increased, and the collector-base junction of the transistor T5 is not broken. Furthermore, an internal transistor (not shown) incorporated in the internal constant voltage circuit 102 is not broken. The resistors R5 and R6 have a function of adjusting the base current for the output transistor T1.

According to the first embodiment, the transistors T2 and T3 of the first feed circuit 104 (corresponding to a feed circuit of the present invention) are turned off when the surge detection circuit 101 detects no power surge voltage. Therefore, d.c. electric power can be saved effectively.

As described above, the first embodiment of the present invention provides a load actuating circuit with a surge protection function comprising: an output transistor (T1) having a collector receiving a power voltage from a power line (200) and an emitter connected to one end of a load (202) that is grounded at the other end; a control circuit (103) controlling an electric potential of a control electrode (i.e., gate) of the output transistor (T1) to turn on or off the output transistor (T1); a surge detection circuit (101) detecting a power surge voltage superposed on the power voltage of the power line (200); and a feed circuit (104) responsive to a surge detection voltage of the surge detection circuit (101) for supplying current to the control electrode of the output transistor (T1) from the power line (200) to turn on the output transistor (T1) forcibly when any power surge voltage is detected by the surge detection circuit (101), thereby effectively absorbing the power surge voltage superposed on the electric power.

According to the arrangement of the first embodiment, the feed circuit (104) does not include any constant-voltage diode (i.e., Zener diode) equivalent to that shown in the conventional surge sensitive circuit previously described. This is advantageous in that the base-collector voltage of the emitter-follower transistor can be reduced by an amount corresponding to a voltage drop at this Zener diode. Furthermore, according to the arrangement of the first embodiment, the base-collector terminals of the emitter-follower transistor can be easily short-circuited. This is advantageous compared with a conventional circuit in that the collector loss of the emitter-follower transistor is remarkably reduced when a power surge voltage is absorbed.

As the output transistor of the first embodiment, it is possible to adopt a bipolar transistor or IGBT (i.e., insulated gate bipolar transistor).

Preferably, the surge detection circuit (101) comprises a constant-voltage diode (D3, D4, D5) and a resistance element (R11, R12; R21) connected in series between the power line (200) and a ground line (201). The power surge voltage is detected by a voltage drop at the resistance element (R11, R12). Thus, the power surge voltage can be detected quickly.

The resistance element for the first embodiment can be replaced by any other element, such as a transistor, that has a tendency of increasing its voltage drop in accordance with current flowing therethrough.

In more detail, the constant-voltage diode (D3) of the surge detection circuit (101) has a cathode connected to the power line (200). A lower-potential terminal of the resistance element (R12) of the surge detection circuit (101) is connected to the ground line (201). The feed circuit (104) comprises an inversion circuit (T3, R3, R4) and an activation control section (T2). The inversion circuit (T3, R3, R4) is turned on in response to the surge detection voltage produced from the surge detection circuit (101) and generates a low-level potential. And, the activation control circuit (T2) is turned on in response to the low-level potential of the inversion circuit (T3, R3, R4) and supplies electric power from the power line (200) to the control electrode of the output transistor (T1).

This arrangement is advantageous in that the d.c. power consumption of a transistor can be reduced to zero when the power surge voltage is not produced. Furthermore, the power consumption can be reduced significantly compared with a surge detecting method based on resistance division.

Still further, the load actuation circuit of the first embodiment comprises a junction diode (D2) preventing backward current flowing from the control electrode of the output transistor (T1) to an output terminal of the control circuit (103). This arrangement is advantageous in the following reasons.

As a comparative circuit, there may be a control circuit that absorbs current from the control electrode of an output transistor when the output transistor is turned off. In such a control circuit, the output transistor cannot be turned on quickly because of the phenomenon that the control circuit absorbs the current from the control electrode of the output transistor. And, the collector loss is increased. However, according to the above-described first embodiment, the junction diode (D2) surely prevents the backward current flowing from the control electrode of the output transistor (T1) to the output terminal of the control circuit (103). Therefore, the electric potential of the control electrode of the output transistor (T1) can be quickly increased. Thus, a speedy absorption of the power surge voltage by the output transistor can be realized.

Furthermore, the feed circuit (104) may apply a significant high potential to the control electrode of the output transistor (T1) due to the generation of a power surge voltage. Even in such a case, the junction diode (D2) surely prevents such an extraordinary potential from entering into the control circuit (103). Thus, the delicate junction of an internal transistor in the control circuit is surely protected against a power surge voltage.

Regarding the junction diode (D2) of this embodiment, it can be constituted by a single junction diode or a plurality of junction diodes.

Yet further, according to the arrangement of the first embodiment, the control circuit (103) has an output terminal grounded only through the load (202). In other words, the output stage of the control circuit (103) has an open-emitter or open-collector arrangement.

When any power surge voltage is generated, the feed circuit charges the control electrode of the output transistor. The arrangement of the first embodiment is advantageous in that, in this moment, the current of the feed circuit does not flow partly into the control circuit. Accordingly, the potential of the control electrode of the output transistor can be increased quickly.

Furthermore, all of the current supplied from the feed circuit entirely flows into the emitter of the output transistor via its base. This is effective to improve the rate of increase of the control electrode potential in the output transistor of an emitter-follower transistor.

Still further, the first embodiment of the present invention provides a load actuation circuit with a surge protection function characterized by the following features. An output transistor (T1) has a collector receiving a power voltage from a power line (200) and an emitter connected to one end of a load (202) that is grounded at the other end. A control circuit (103) controls an electric potential of a control electrode of the output transistor (T1) to turn on or off the output transistor (T1). A feed circuit (104) supplies current to the control electrode of the output transistor (T1) from the power line (200) to turn on the output transistor (T1) forcibly when any power surge voltage is superposed on the power voltage of the power line (200). The control circuit (103) has an output terminal grounded only through the load (202). Thus, any power surge voltage is effectively absorbed by the output transistor.

Especially, according to the arrangement of the first embodiment, the output terminal of the control circuit (103) is grounded only through the load (202). In other words, the output stage of the control circuit (103) is constituted by an open-collector or open-emitter arrangement as described above. Thus, the above-described effect can be obtained.

Yet further, the first embodiment of the present invention provides a load actuation circuit with a surge protection function characterized by the following features. An output transistor (T1) has a collector receiving a power voltage from a power line (200) and an emitter connected to one end of a reactance load (202) that is grounded at the other end. A control circuit (103) controls a base potential of the output transistor (T1) to turn on or off the output transistor (T1). And, a feed circuit (105) supplies current to a base of the output transistor (T1) from a ground line (201) when the base potential of the output transistor (T1) falls below a ground potential by an amount exceeding a collector-base withstanding voltage of the output transistor (T1).

This arrangement is advantageous in that the output transistor (T1) can be surely protected against a negative surge voltage without increasing the base-collector withstanding voltage of the output transistor.

Moreover, the feed circuit (105) comprises a resistance element (R2) connecting the base of the output transistor (T1) to the ground line (201), and a junction diode (D1) connected in series with the resistant element (R2) to prevent current from flowing across the resistant element (R2) in a direction from the base of the output transistor (T1) to the ground line (201). Thus, the circuit arrangement can be simplified.

Second Embodiment

Figure 2:
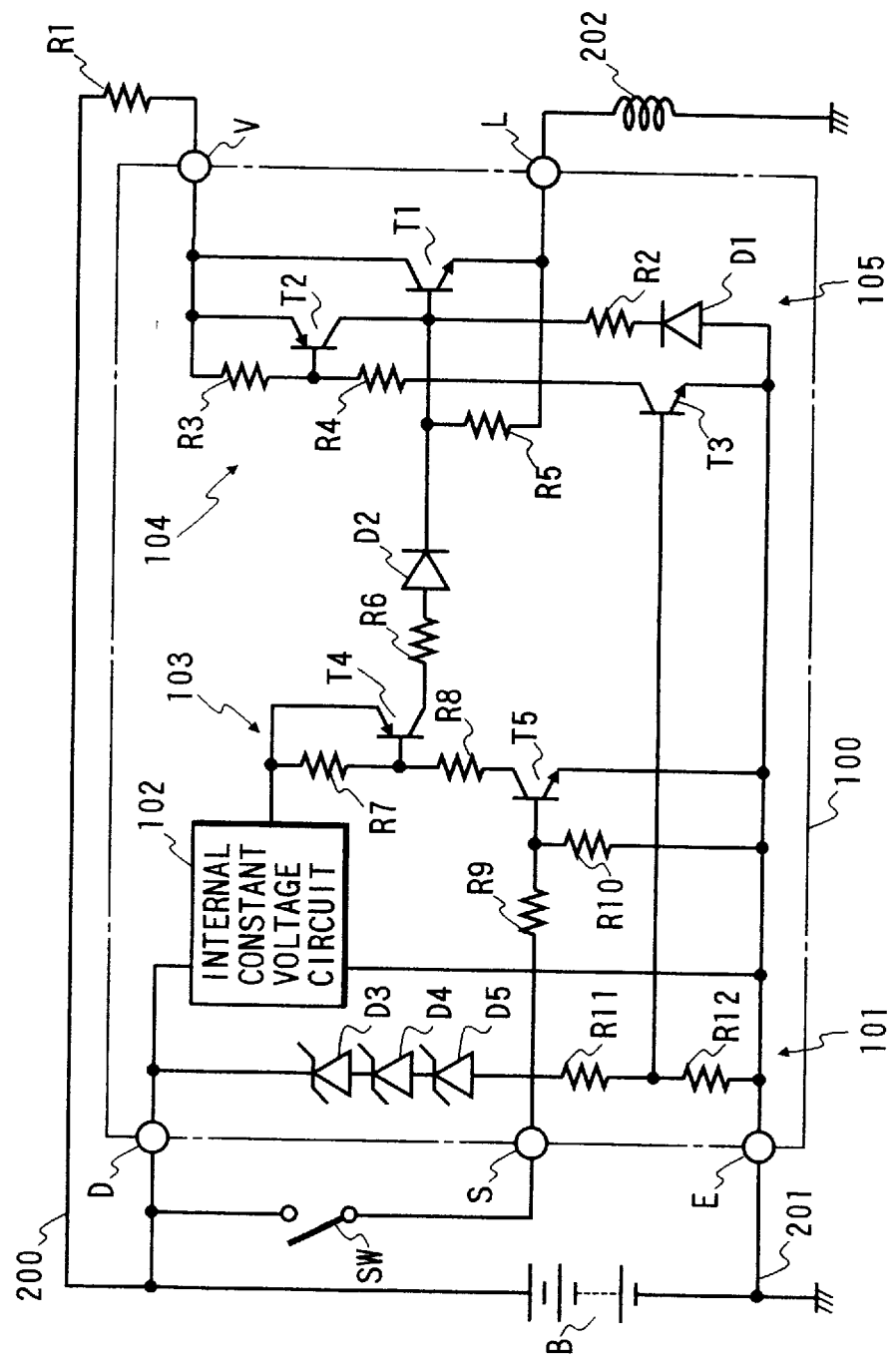
FIG. 2 is a circuit diagram showing a load actuation circuit in accordance with a second embodiment of the present invention.

A second embodiment will be explained with reference to FIG. 2. The second embodiment is different from the first embodiment in that a resistor R1 is provided between the high voltage terminal of the battery B and the terminal V of the load actuation circuit 100. The resistor R1 has a low resistance. According to the arrangement of the second embodiment, electric power is supplied to the first feed circuit 104 and the collector of output transistor T1 via the resistor R1. This is effective to delay the arrival of any power surge voltage to the output transistor T1 and suppress the wave height of the power surge voltage. Accordingly, the protection function of the output transistor T1 can be further improved.

As apparent from the foregoing description, the collector of the output transistor (T1) is connected to the power line (200) via a resistance element (R1). Thus, it becomes possible to attenuate any power surge voltage applied to the collector. The output transistor (T1) can be surely prevented from being damaged. The application timing of the power surge voltage can be delayed adequately. Thus, any delay in an ON operation of the output transistor can be compensated.

Third Embodiment

Figure 3:
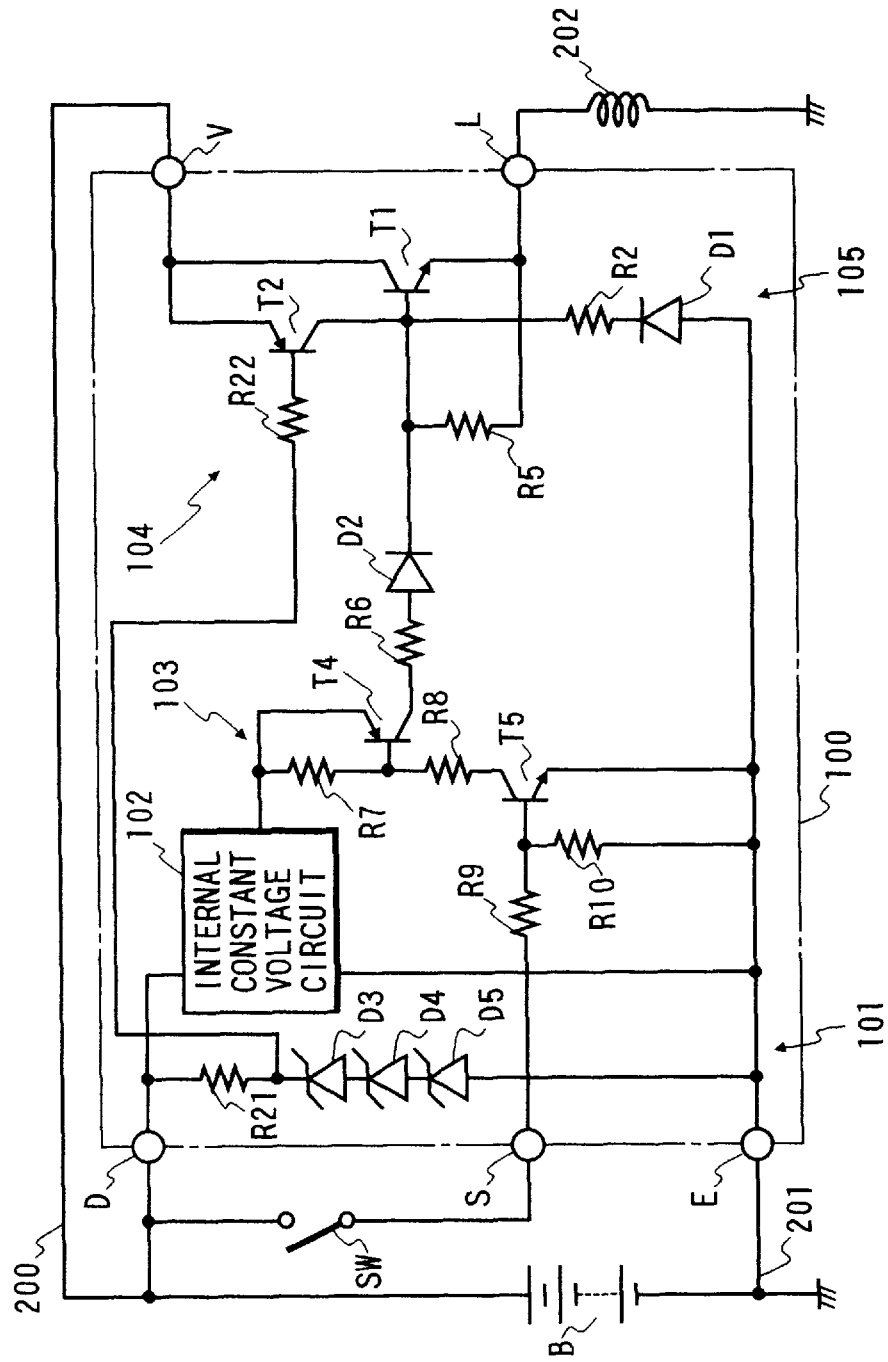
FIG. 3 is a circuit diagram showing a load actuation circuit in accordance with a third embodiment of the present invention.

A third embodiment will be explained with reference to FIG. 3. The third embodiment is different from the first embodiment in the arrangement of the surge detection circuit 101 and the arrangement of the first feed circuit 104. More specifically, the surge detection circuit 101 comprises Zener diodes D3, D4 and D5 serially connected and disposed at its low-voltage side. An anode of the lowermost Zener diode (i.e., constant-voltage diode) D5 is connected to the ground line 201. A resistor R21 is connected in series with these Zener diodes D3, D4 and D5 and disposed at the high-voltage side of the surge detection circuit 101. A high-potential terminal of the resistor R21 is connected to the power line 200. The first feed circuit 104 is constituted by a combination of a resistor R22 and the transistor T2. The resistor R22 has a function of limiting the amount of current supplied to the base of transistor T2.

In this case, it is possible to omit the resistor R22 and replace the resistor R21 by the voltage dividing circuit (R11 and R12) shown in FIG. 1.

An operation of the third embodiment will be explained below.

A power surge voltage may occur with a magnitude causing a breakdown of Zener diodes D3, D4 and D5. In response to this nondestructive breakdown of Zener diodes D3, D4 and D5, current flows across the resistor R21 and the transistor T2 is turned on. Then, electric power is supplied from the power line 200 to the output transistor T1 via the thus-activated transistor T2. The output transistor T1 is turned on accordingly. Thus, power surge voltage superposed on power line 200 is absorbed by the output transistor T1 effectively and is attenuated sufficiently.

The arrangement of the third embodiment has a small circuit delay. Hence, the output transistor T1 can be activated quickly in response to a power surge voltage.

Furthermore, the arrangement of the first feed circuit 104 consisting of resistor R22 and transistor T2 is advantageous in that d.c. electric power consumption is small and the circuit arrangement is simple.

As described above, according to the third embodiment of the present invention, the constant-voltage diode (D5) of the surge detection circuit (101) has an anode connected to the ground line (201). A higher-potential terminal of the resistance element (R21) of the surge detection circuit (101) is connected to the power line (200). The feed circuit (104) comprises a transistor (T2) turned on in response to the surge detection voltage produced from the surge detection circuit (101) and supplies a high-level potential to the control electrode of the output transistor (T1).

With this arrangement, it becomes possible to reduce the d.c. power consumption of the transistor to zero when no power surge voltage is generated. Furthermore, in the same manner in the first embodiment, the power consumption can be reduced. Yet further, according to the third embodiment, the feed circuit (104) has a single-stage arrangement. This is advantageous in that the circuit arrangement can be simplified and the on-delay time can be reduced. Accordingly, the absorption of a power surge voltage can be quickly accomplished.

Fourth Embodiment

Figure 4:
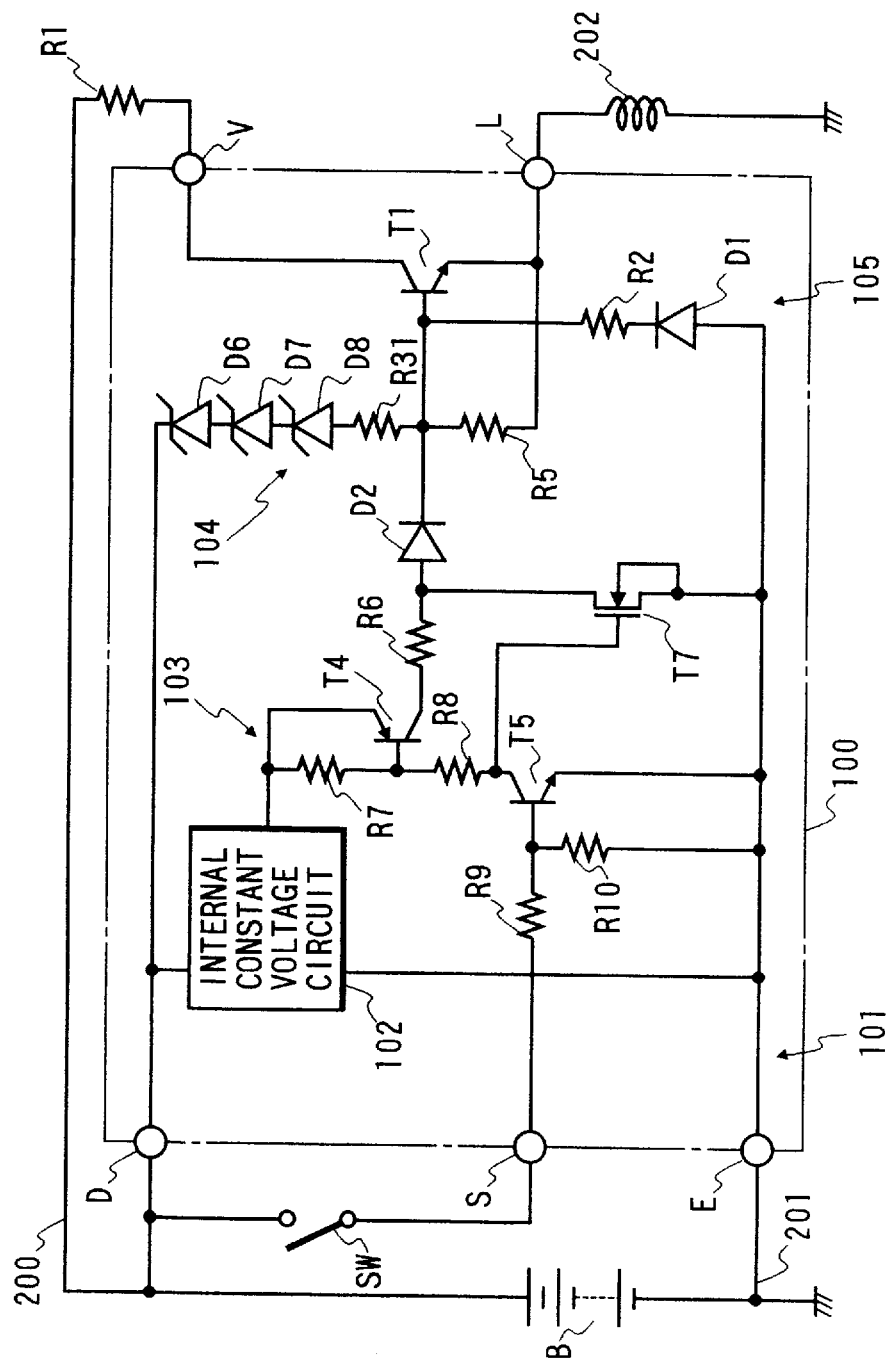
FIG. 4 is a circuit diagram showing a load actuation circuit in accordance with a fourth embodiment of the present invention.

A fourth embodiment will be explained with reference to FIG. 4. The fourth embodiment is different from the second embodiment in that the surge detection circuit 101 is omitted and the first feed circuit 104 is constituted differently. More specifically, the first feed circuit 104 is provided between the power line 200 and the base of output transistor T1. The first feed circuit 104 comprises Zener diodes D6, D7 and D8 serially connected. A resistor R31 is connected in series with these Zener diodes D6, D7 and D8. The resistor R31 has a low resistance and acts as a means for limiting current flowing through the Zener diodes D6, D7 and D8.

Furthermore, an NMOS transistor T7 is provided with one end connected to an intermediate point between resistor R6 and junction diode D2 and the other end connected to ground. This NMOS transistor T7 has a source grounded, a drain connected to an anode of the junction diode D2, and a gate connected to the collector of transistor T5.

When a power surge voltage superposed on the power voltage is large enough to cause a breakdown of Zener diode D6, D7 and D8, breakdown current flows through resistor R31 into the base of output transistor T1. Thus, the output transistor T1 is turned on and absorbs the power surge voltage. The transistor T7 has a function of quickly discharging a parasitic capacitance stored in the vicinity of the junction diode D2. This makes it possible to increase the cutoff speed of junction diode D2. In other words, speedup in the cutoff operation of the junction diode D2 improves the cutoff response of the output transistor T1.

In this forth embodiment, the junction diode D2 functions in the same manner as those disclosed in the above-described first to third embodiments. Furthermore, in an event of the breakdown of Zener diodes D6, D7 and D8 due to a power surge voltage, the junction diode D2 of the fourth embodiment prevents the breakdown current from flowing into the transistor T7. Thus, the base potential of the output transistor T1 is smoothly increased.

As described above, the fourth embodiment of the present invention provides a load actuation circuit with a surge protection function comprising: an output transistor (T1; emitter-follower transistor) having a collector receiving a power voltage from a power line (200) and an emitter connected to one end of a load (202) that is grounded at the other end; a control circuit (103) controlling an electric potential of a control electrode of the output transistor (T1) to turn on or off the output transistor (T1); a feed circuit (104) supplying current to the control electrode of the output transistor (T1) from the power line (200) to turn on the output transistor (T1) forcibly when any power surge voltage is superposed on the power voltage of the power line (200); and a junction diode (D2) preventing backward current flowing from the control electrode of the output transistor (T1) to an output terminal of the control circuit (103). Therefore, any power surge voltage can be surely absorbed by the output transistor (T1).

According to the arrangement of the fourth embodiment, the junction diode (D2) effectively prevents the backward current flowing from the control electrode of the output transistor (T1) to an output terminal of the control circuit (103). Therefore, the same effects as those described in the first embodiment can be obtained.

Furthermore, according to the arrangement of the fourth embodiment, the feed circuit (104) comprises a constant-voltage diode (D6, D7, D8) and a current-limiting resistance element (R31) serially connected between the power line (200) and the control electrode of the output transistor (T1). This arrangement is advantageous in that the circuit arrangement can be simplified. Moreover, a high-speed charging for the output transistor can be realized.

Fifth Embodiment

Figure 5:
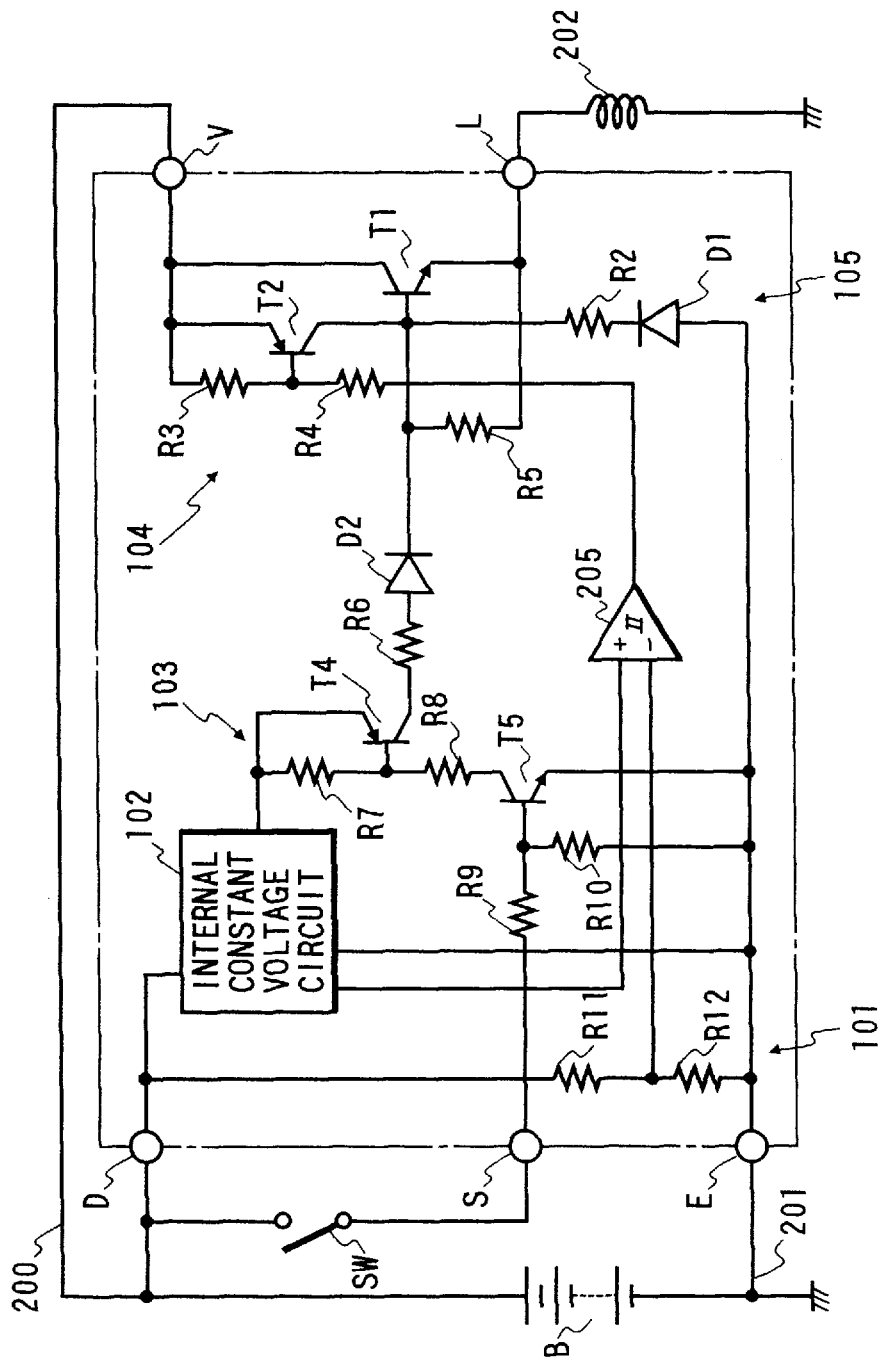
FIG. 5 is a circuit diagram showing a load actuation circuit in accordance with a fifth embodiment of the present invention.

A fifth embodiment will be explained with reference to FIG. 5. The fifth embodiment is different from the first embodiment in the arrangement of the surge detection circuit 101 and the first feed circuit 104. More specifically, Zener diodes D3, D4 and D5 are removed from the surge detection circuit 101. And, the transistor T3 in the first feed circuit 104 is replaced by a schmitt trigger circuit 205. Instead of using schmitt trigger circuit 205, a comparator or a differential amplifier can be used as a comparable component replaceable with the schmitt trigger circuit 205.

When a power surge voltage superposed on the power line 200 exceeds a predetermined level, its divided voltage may exceed a reference voltage of a high-level terminal of schmitt trigger circuit 205. In such a case, the schmitt trigger circuit 205 generates a low-level signal. In response to this low-level signal, the transistor T2 is turned on and the output transistor T1 is turned on. Thereafter, when the power surge voltage superposed on the power line 200 is decreased, the divided voltage of the power surge voltage may fall below the reference voltage of the high-level terminal of schmitt trigger circuit 205. In this case, the schmitt trigger circuit 205 generates a high-level signal. In response to this high-level signal, the transistor T2 is turned off and the output transistor T1 is turned off.

According to the fifth embodiment, the output transistor T1 is surely maintained at its on condition once the generation of a power surge voltage is detected, until the power surge voltage is sufficiently reduced. Hence, the performance for absorbing a power surge voltage can be maintained adequately.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A load actuation circuit with a surge protection function comprising:

an output transistor having a collector receiving a power voltage from a power line, an emitter connected to one end of a load that is grounded at the other end, and a control electrode;

a control circuit for controlling an electric potential of said control electrode of said output transistor to turn on or off said output transistor;

a surge detection circuit connected between said power line and a ground line in parallel with said output transistor for detecting a power surge voltage superposed on said power voltage of said power line, said surge detection circuit including a constant-voltage diode; and a feed circuit responsive to a surge detection voltage of said surge detection circuit for supplying a current to said control electrode of said output transistor from said power line to turn on said output transistor when any power surge voltage is detected by said surge detection circuit, said feed circuit causing a voltage drop between said collector and said control electrode of said output transistor when said output transistor is turned on in response to said surge detection voltage of said surge detection circuit, said voltage drop at said output transistor being smaller than a voltage drop at said constant-voltage diode of said surge detection circuit.

2. The load actuation circuit with a surge protection function in accordance with claim 1, wherein said surge detection circuit comprises a resistance element connected in series with said constant-voltage diode between said power line and a ground line, and said power surge voltage is detected by a voltage drop at said resistance element.

3. The load actuation circuit with a surge protection function in accordance with claim 1, wherein the collector of said output transistor is connected to the power line via a resistant element.

4. The load actuation circuit with a surge protection function in accordance with claim 1, further comprising a junction diode serially connected between an output terminal of said control circuit and said control electrode of said output transistor for preventing a backward current from flowing from said control electrode to said output terminal.

5. The load actuation circuit with a surge protection function in accordance with claim 1, wherein said control circuit has an output terminal grounded only through said load.

6. A load actuation circuit with a surge protection function comprising:

an output transistor having a collector receiving a power voltage from a power line and an emitter connected to one end of a load that is grounded at the other end;

a control circuit for controlling an electric potential of a control electrode of said output transistor to turn on or off said output transistor;

a surge detection circuit for detecting power surge voltage superposed on said power voltage of said power line; and a feed circuit responsive to a surge detection voltage of said surge detection circuit for supplying a current to said control electrode of said output transistor from said power line to turn on said output transistor when any power surge voltage is detected by said surge detection circuit, wherein said surge detection circuit comprises a constant-voltage diode and a resistance element connected in series between said power line and a ground line, and said power surge voltage is detected by a voltage drop at said resistance element, said constant-voltage diode of said surge detection circuit has a cathode connected to said power line;

a lower potential terminal of said resistance element of said surge detection circuit is connected to the ground line;

said feed circuit comprises an inversion circuit and an activation control section;

said inversion circuit is turned on in response to said surge detection voltage produced from said surge detection circuit and generates a low-level potential; and said activation control circuit is turned on in response to the low-level potential of said inversion circuit and supplies electric power from said power line to said control electrode of said output transistor.

7. A load actuation circuit with a surge protection function comprising:

an output transistor having a collector receiving a power voltage from a power line and an emitter connected to one end of a load that is grounded at the other end;

a control circuit for controlling an electric potential of a control electrode of said output transistor to turn on or off said output transistor;

a surge detection circuit for detecting a power surge voltage superposed on said power voltage of said power line; and a feed circuit responsive to a surge detection voltage of said surge detection circuit for supplying a current to said control electrode of said output transistor from said power line to turn on said output transistor when any power surge voltage is detected by said surge detection circuit, wherein said surge detection circuit comprises a constant-voltage diode and a resistance element connected in series between said power line and a ground line, and said power surge voltage is detected by a voltage drop at said resistance element, said constant-voltage diode of said surge detection circuit has an anode connected to said ground line;

a higher-potential terminal of said resistance element of said surge detection circuit is connected to the power line; and said feed circuit comprises a transistor turned on in response to said surge detection voltage produced from said surge detection circuit and supplies a high-level potential to said control electrode of said output transistor.

8. A load actuation circuit with a surge protection function comprising:

an output transistor having a collector receiving a power voltage from a power line and an emitter connected to one end of a load that is grounded at the other end, and a control electrode;

a control circuit controlling an electric potential of said control electrode of said output transistor to turn on or off said output transistor;

a feed circuit supplying current to said control electrode of said output transistor from said power line to turn on said output transistor when any power surge voltage is superposed on the power voltage of said power line; and a junction diode serially connected between an output terminal of said control circuit and said control electrode of said output transistor for preventing a backward current from flowing from said control electrode to said output terminal.

9. The load actuation circuit with a surge protection function in accordance with claim 8, wherein said feed circuit comprises a constant-voltage diode and a current-limiting resistant element serially connected between said power line and said control electrode of said output transistor.

10. A load actuation circuit with a surge protection function comprising:

an actuating transistor having one output terminal connected to a power line and the other output terminal grounded via a load;

an actuating circuit producing a control signal that is supplied to a control terminal of said actuating transistor to turn on said actuating transistor;

a surge detection circuit connected between said power line and a ground line in parallel with said actuating transistor for detecting a surge voltage superposed on a power voltage of said power line, said surge detecting circuit including a constant-voltage diode; and a surge actuating transistor responsive to a surge detection voltage of said surge detection circuit and supplying an actuation signal to said control terminal of said actuating transistor to turn on said actuating transistor forcibly irrespective of said control signal produced from said actuating circuit, said surge actuating transistor having one output terminal connected to said power source and the other terminal connected to said control terminal of said actuating transistor, said surge actuating transistor causing a voltage drop between said power line and said control terminal of said actuating transistor when said actuating transistor is turned on in response to said surge detection voltage of said surge detection circuit, said voltage drop at said actuating transistor being smaller than a voltage drop at said constant-voltage diode of said surge detecting circuit.

11. The load actuation circuit with a surge protection function in accordance with claim 10, wherein said one output terminal of said actuating transistor is connected to the power line via a resistant element.

12. The load actuation circuit with a surge protection function in accordance with claim 10, further comprising a junction diode serially connected between an output terminal of said actuating circuit and said control terminal of said actuating transistor for preventing a backward current from flowing from said control terminal to said output terminal.

* * * * *